United States Patent [19]

Phang et al.

[11] Patent Number: 5,569,920
[45] Date of Patent: Oct. 29, 1996

[54] RETRACTABLE CATHODOLUMINESCENCE DETECTOR WITH HIGH ELLIPTICITY AND HIGH BACKSCATTERED ELECTRON REJECTION PERFORMANCE FOR LARGE AREA SPECIMENS

[75] Inventors: J. C. H. Phang; W. K. Cbim; D. S. H. Chan; Y. Y. Liu, all of Kent Ridge Crescent, Singapore

[73] Assignee: National University of Singapore, Kent Ridge, Singapore

[21] Appl. No.: 490,352

[22] Filed: Jun. 14, 1995

[51] Int. Cl.⁶ .................................................. H01J 37/244
[52] U.S. Cl. .......................................... 250/310; 250/397
[58] Field of Search ....................................... 250/310, 397

[56] References Cited

U.S. PATENT DOCUMENTS

| | | | |
|---|---|---|---|
| 3,790,781 | 2/1974 | Horl et al. | 250/310 |
| 4,900,932 | 2/1990 | Schafer et al. | 250/397 |
| 4,929,041 | 5/1990 | Vahala et al. | 350/96.10 |
| 5,010,253 | 4/1991 | Braglia et al. | 250/399 |
| 5,264,704 | 11/1993 | Phang et al. | 250/347 |
| 5,382,796 | 1/1995 | Koike | 250/310 |

OTHER PUBLICATIONS

Journal of Microscopy, vol. 107, Pt. 2, Jul., 1976, pp. 107–128.

Primary Examiner—Bruce C. Anderson
Attorney, Agent, or Firm—David H. Jaffer

[57] ABSTRACT

A cathodoluminescence detection system including a semi-ellipsoidal mirror of high ellipticity, with the mirror constructed of material of low atomic number to minimize interference caused by backscattered electrons. An emission radiation guide is mounted in line with the axis of rotation of the mirror to optimize CL radiation collection. Low detector height provides high spatial resolution in electron beam systems.

17 Claims, 1 Drawing Sheet

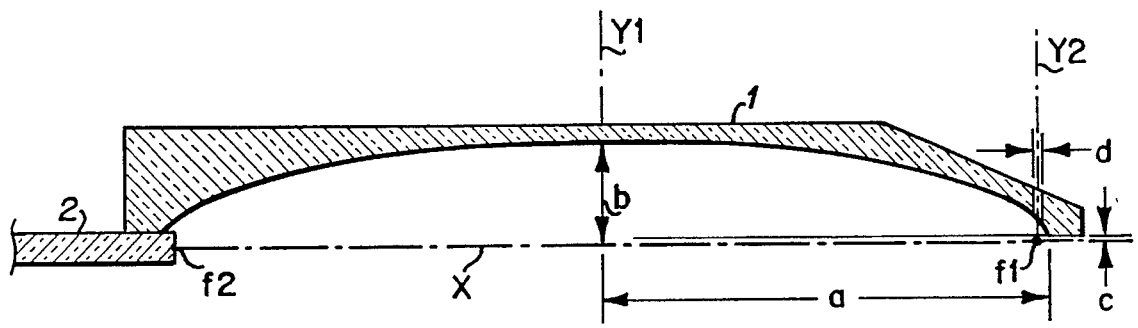
Fig_1
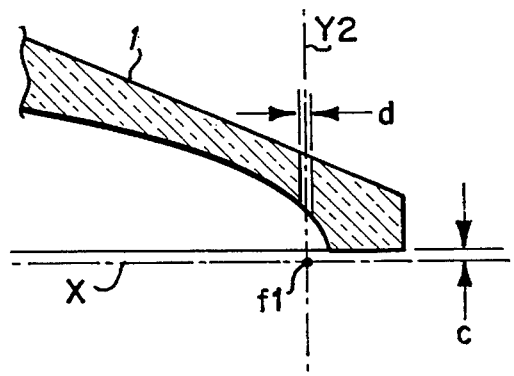
Fig_2

RETRACTABLE CATHODOLUMINESCENCE DETECTOR WITH HIGH ELLIPTICITY AND HIGH BACKSCATTERED ELECTRON REJECTION PERFORMANCE FOR LARGE AREA SPECIMENS

BACKGROUND OF THE INVENTION

1. Field of the Invention

This invention relates generally to a cathodoluminescence (CL) detection device and more particularly to a CL detection device utilizing a concave mirror of semi-ellipsoidal shape with high ellipticity. The mirror material is of low effective atomic number, which ensures that most of the backscattered electrons (BSEs) emitted simultaneously with CL emissions are absorbed.

2. Brief Description of the Prior Art

Cathodoluminescence is the emission of radiation from materials due to an incident electron beam. The phenomenon can be used to provide information on the properties of materials and devices. When the beam strikes the specimen, the spectrum of the emissions from the specimen can be obtained with a CL detection device fitted with a wavelength selector and a suitable emission sensitive detector. Monochromatic and panchromatic CL images can be obtained with an appropriate image recording instrument. For monochromatic imaging, a wavelength selector is inserted to select a particular wavelength or a range of wavelengths of emissions with which to form the image. For panchromatic imaging, the wavelength selector is bypassed.

Due to the difficulties in mirror design, most existing CL detectors are unable to perform both spectroscopy and microscopy. For example, the CL detectors described by Phang, et al. in U.S. Pat. No. 5,264,704 and Braglia, et al. in U.S. Pat. No. 5,010,253 lack spectroscopic abilities due to their direct detection of emitted radiation without passing through a wavelength selector. A further disadvantage of these CL detectors is that they have to use solid state detectors which are less sensitive than a photomultiplier tube (PMT).

The most important issue for spectroscopic CL applications lies in the efficiency of the detector in transmitting the collected radiation to a radiation sensitive device. The way in which the radiation is collected and transmitted seriously affects the sensitivity as well as the flexibility of the CL detector. Efficient transmission of radiation from the mirror to the radiation guide and the wavelength selector requires the incoming radiation to be confined within a small cone with an angle which is less than a critical value. Radiation outside the cone is not collected and losses in transmission will be incurred. The problems of designing a CL detector with both spectroscopic and imaging capabilities without losing collection and transmission efficiencies are described by Steyn, et al. in 107 *J. Microscopy* Pt. 2, 107–128 (July, 1976) ("An efficient spectroscopic detection system for cathodoluminescence mode scanning electron microscopy (SEM)"). The systems described by Vahala, et al. (U.S. Pat. No. 4,929,041), Schafer, et al. (U.S. Pat. No. 4,900,932) and Horl, et al. (U.S. Pat. No. 3,790,781) relate to CL detectors having this problem of transmission inefficiency arising from poor coupling from the mirror to the radiation guide and the wavelength selector. The systems of Vahala, et al. and Horl, et al. are also limited in terms of the specimen size which can be observed. Furthermore, these detectors are not easily retractable from the path of the electron beam and therefore do not allow other modes of electron beam imaging without extensive modifications to the system.

The height of the mirror in a CL system limits the minimum distance between the specimen and the electron beam generator unit. This has an impact on the spatial resolution performance of the system. For this reason, in CL observations requiring high spatial resolution, the height of the mirror must be kept small. Apart from the CL detector described by Braglia, et al., all of the patents discussed above are severely limited in this aspect.

SUMMARY OF THE INVENTION

It is a primary object of the present invention to provide a cathodoluminescence detection system with both spectroscopic and imaging capabilities, having high collection and transmission efficiencies as well as low mirror height to allow high spatial resolution from an electron beam generator system.

Another object of the present invention is to provide an efficient CL detector with a mirror having as low an atomic number as possible so that BSEs can be absorbed, thereby reducing stray CL signals produced by BSEs.

A further object of the present invention is to provide a CL system which can perform simultaneous observation of CL signals with other signal modes, for example secondary electrons, thereby enabling a comparative study of different signals at the same time and on the same region on the specimen.

Still another object is to provide a CL system which is suitable for large specimen size and which is easily retractable from the path of the electron beam.

Briefly, the preferred embodiment of the present invention is a CL detector system including a semi-ellipsoidal mirror of high ellipticity, with the mirror constructed of material of low atomic number to minimize interference caused by BSEs. A radiation guide is mounted in line with the axis of rotation of the mirror to optimize CL radiation collection, to minimize detector height for large area specimens, and to obtain high spatial resolution from electron beam generator systems.

IN THE DRAWING

FIG. 1 is a cross-section illustrating details of the cathodoluminescence detection system of the present invention; and FIG. 2 is an expanded view showing further detail of the first focal point and electron beam access of the cathodoluminescence detector system of FIG. 1.

DESCRIPTION OF THE PREFERRED EMBODIMENT

Electron beam systems with cathodoluminescence detection systems are well known in the prior art, and the references discussed above show typical arrangements of such systems.

The most essential part of a CL detection system lies in its collector design. Due to the lack of detailed calculations, previous CL detector designs were not optimized. In this invention, detailed computation was carried out using a two-dimensional ray tracing program as a design tool. This resulted in the invention of a concave mirror of semi-ellipsoidal shape with the following features: (i) high coupling and transmission efficiencies for the radiation guide and the wavelength selector, (ii) compatibility with large specimen size, and (iii) compatibility with the short working distance requirement of electron beam systems.

As noted in the discussion of prior art, efficient transmission of radiation requires that radiation collected by the mirror be confined within a cone with an angle less than a critical value. We have found that a semi-ellipsoidal mirror of high ellipticity should be used. In particular, when ellipticity of an ellipse "e" is defined as:

$$e^2 = 1 - b^2/a^2$$

with "a" the major semiaxis of the ellipse and "b" the minor semiaxis of the ellipse, ellipticity "e" greater than 0.8 is preferred. Our calculations also showed that at high ellipticities, if the emission collection means (preferably a radiation guide such as an optical fiber, leading to a remote spectrometer/emission sensitive detector, but alternatively an emission sensitive detector) are positioned at one focal point of the mirror, and aligned such that the face of the emission collection means is centered upon and substantially perpendicular to the axis connecting the focal points of the mirror (the axis of rotation of the emission collection means in line with the axis of rotation of the mirror), then radiation from a much wider area of the specimen can be detected efficiently. This advantageous arrangement gives the CL detector both spectroscopic and imaging capabilities without losing the collection and transmission efficiencies.

Referring now to FIG. 1, the details of the CL system of the present invention are schematically illustrated. The main components of the system are concave mirror 1 and radiation guide 2, located within the electron microscope vacuum chamber. Radiation guide 2 is preferably an optical fiber or optical fiber bundle with a diameter of approximately 3 mm. Radiation guide 2 serves as a portion of the CL detection means, as it directs radiation collected from mirror 1 to the spectrometer (if used) and radiation sensitive detector (the spectrometer and detector are not shown). A particular advantage of the configuration shown in FIG. 1 is that the mirror and radiation guide can easily be inserted and fully retracted out from the electron beam path by means of a retractable attachment (not shown). The retractable attachment is further engaged onto a movable holder (not shown) that provides a focusing function of the mirror.

Concave mirror 1 is preferably substantially a semi-ellipsoid (i.e., substantially a 180 degree rotational cross section around the axis joining the first and second ellipse focal points f1 and f2). The major semiaxis of the mirror is identified by the length "a" along axis x and the minor semiaxis of the mirror is identified by the length "b" along axis y1. In the preferred embodiment, a is approximately 21 mm and b is approximately 7.7 mm. Above focal point f1, a cylindrical hole with diameter d is opened along the axis y2 through the body of the mirror for the electron probe to access the specimen. An expanded view is shown in FIG. 2. Diameter d is typically on the order of 1 mm. The specimen is sited at f1 with its surface in line with the axis x, and below the mirror at an elevation c (typically 0.5 mm). A small portion may be removed from the bottom of the rotational ellipsoid mirror to obtain elevation c (i.e. the mirror need not be a full one half rotational ellipsoid).

The center of the cathodoluminescence radiation emission collection means is preferably sited on focal point f2 with the collection face of the emission collection means substantially perpendicular to the axis connecting focal points f1 and f2. In the preferred embodiment as shown in FIG. 1, the emission collection means is an optical fiber radiation guide 2, which directs the collected CL to a radiation sensitive detector. Alternatively, the emission detection means can be a radiation sensitive detector sited at f2. This advantageous arrangement, which results in horizontal positioning of the radiation guide (or other emission collection means), also leads to compatibility with large specimens. Since the radiation guide is horizontal, the guide is less likely to interfere with a specimen.

As noted above, for CL observation requiring high spatial resolution, the height of the mirror must be kept small. The present invention achieves high resolution CL performance because the height of the mirror has been made compatible to the required working distance between the specimen and the electron beam radiator unit. High ellipticity of the mirror allows a relatively smaller mirror height to be used than those of previous designs.

The combination of the high ellipticity and small height of the semi-ellipsoid mirror is difficult to fabricate. The mirror of the present invention has successfully been fabricated by the procedure described below.

As a first consideration in mirror fabrication, a low atomic number material is used for producing the mirror. Low atomic number material reduces BSE effects to a negligible level. Materials of atomic number less than 18 are preferred. In particular, plastic polymers (typically comprising carbon, hydrogen, and oxygen) are well-suited because they are easily molded. Examples of such polymers are polymethylmethacrylate (PMMA) and Araldite.

The mirror can be fabricated using a plastic molding technique. A convex mold of the required semi-ellipsoidal shape is machined using a computer-controlled lathe. The mold is then polished to mirror finish so that no further polishing is required for the surface of the concave mirror molded out in this way. A plastic material in moldable form is used to cast out the desired substance from the mold. The concave surface is then made reflective by evaporation of a thin layer of a conducting and highly reflective material, such as aluminum. It is important to cover all exposed areas (in addition to the concave surface) on the mirror body with conductive material in order to prevent charging effects. Charging can cause undesired deflection of the electron probe which leads to a loss in resolution.

The mirror described above, when used with a radiation guide aligned as described above, collects most of the CL emission from a specimen bombarded by an electron beam into the radiation guide with high optical coupling and transmission efficiencies. The detector system is compatible with a field emission scanning electron microscope (FESEM) which has high spatial resolution where CL emissions are low due to the low total probe current.

Although the present invention has been described above in terms of a specific embodiment, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. A cathodoluminescense detector for collecting light emitted from a specimen irradiated by an electron beam, comprising:

(a) a concave ellipsoidal mirror with an ellipticity greater than 0.8, the mirror having first and second focal points; and (b) collection means located at the second focal point of the mirror, whereby emissions from the first focal point are focused to the second focal point and collected by said collection means.

2. The detector of claim 1, wherein the collection face of said collection means is centered upon and substantially perpendicular to the axis connecting the first and second focal points.

3. The detector of claim 2, wherein the collection means comprises a radiation guide which collects emissions at the second focal point and transmits the emissions to remote detection means.

4. The detector of claim 3, wherein the remote detection means comprises wavelength selection means and a radiation sensitive detector.

5. The detector of claim 1, wherein the major axis "a" of the mirror is from 15 mm to 30 mm, and the minor axis "b" of the mirror is from 5 mm to 10 mm.

6. The detector of claim 1, wherein the mirror is comprised of materials having atomic number less than 18.

7. The detector of claim 1, wherein the inner surface of the mirror is coated with a highly reflective and conductive material.

8. The detector of claim 1, wherein the mirror is a semi-ellipsoid.

9. The detector of claim 8, wherein the collection face of said collection means is centered upon and substantially perpendicular to the axis connecting the first and second focal points.

10. The detector of claim 9, wherein the collection means comprises a radiation guide which collects emissions at the second focal point and transmits the emissions to remote detection means.

11. The detector of claim 10, wherein the remote detection means comprises wavelength selection means and a radiation sensitive detector.

12. The detector of claim 11, wherein the major axis "a" of the mirror is from 15 mm to 30 mm, and the minor axis "b" of the mirror is from 5 mm to 10 mm.

13. The detector of claim 11, wherein the mirror is comprised of materials having atomic number less than 18.

14. The detector of claim 14, wherein the inner surface of the mirror is coated with a highly reflective and conductive material.

15. The detector of claim 8, wherein the major axis "a" of the mirror is from 15 mm to 30 mm, and the minor axis "b" of the mirror is from 5 mm to 10 mm.

16. The detector of claim 8, wherein the mirror is comprised of materials having atomic number less than 18.

17. The detector of claim 8, wherein the inner surface of the mirror is coated with a highly reflective and conductive material.

* * * * *